United States Patent [19]

Sugayama

[11] Patent Number: 4,955,073
[45] Date of Patent: Sep. 4, 1990

[54] AUTOMATIC SEARCH TUNER

[75] Inventor: Sakae Sugayama, Ohra, Japan

[73] Assignee: Sanyo Electric Co., Ltd., Osaka, Japan

[21] Appl. No.: 271,747

[22] Filed: Nov. 15, 1988

[30] Foreign Application Priority Data

Nov. 19, 1987 [JP] Japan .................. 62-292429

[51] Int. Cl.⁵ ............................ H04B 11/16
[52] U.S. Cl. .................... 455/161; 455/165; 455/186; 455/249
[58] Field of Search ............... 455/295, 296, 254, 250, 455/246, 247, 239, 240, 234, 311, 200, 182, 183, 264, 249, 308, 164, 165, 161

[56] References Cited

U.S. PATENT DOCUMENTS 4,355,414 10/1982 Inoue ................... 455/249

FOREIGN PATENT DOCUMENTS 0049030 4/1980 Japan ................... 455/165

OTHER PUBLICATIONS

"Sanyo's 1986 and 1987 Semiconductor IC for Home Audio" (pp. 439–447).

Primary Examiner—Reinhard J. Eisenzopf
Assistant Examiner—Curtis Kuntz
Attorney, Agent, or Firm—Darby & Darby

[57] ABSTRACT

The disclosure relates to an automatic search tuner in which an erroneous stop of an automatic search operation can be prevented by an interference signal generated due to an intermodulation interference. The automatic search tuner comprises an attenuating means for attenuating the level of a received signal in a predetermined amount in response to a signal indicative of stopping an automatic search operation; and a comparing means for comparing the level of a signal obtained when the attenuating means is operating with the level of a signal obtained when the attenuating means is not operating. An automatic search operation is resumed by the signal outputted from the comparing means.

6 Claims, 3 Drawing Sheets

AUTOMATIC SEARCH TUNER

BACKGROUND OF THE INVENTION

1. Field of the Invention

The present invention relates to the improvement of an automatic search tuner, and more particularly, to an automatic search tuner in which an erroneous stop of an automatic search operation can be prevented by an interference signal generated due to an intermodulation interference.

2. Description of Related Arts

On page 439 through 447 of a data book entitled "SANYO's 1986 and 1987 Semiconductor Integrated Circuit for Home Audio" published on Aug. 10, 1986, an IC (LM 7000) for a frequency synthesizer for use in an automatic search tuner is described. The above-described IC including a phase-locked loop (PLL) for changing a local oscillation frequency has a search function of automatically changing the dividing ratio of a programmable divider constituting the PLL in response to an automatic search signal. The IC is also provided with a search stop circuit of an IF count system to count pulses generated according to the frequency of an IF signal and generate a search stop signal when a counted value has reached a predetermined value.

FIG. 2 is a circuit diagram of an automatic search tuner constituted by using the IC. In FIG. 2, a signal received by an antenna 1 is amplified by a radio frequency (RF) amplifying circuit 2, and then, mixed with a signal outputted from a local oscillation circuit 4 so as to convert the signal into an intermediate frequency (IF) signal. The IF signal is amplified by an IF amplifying circuit 5 and detected by a detecting circuit 6 to generate a signal at the output terminal of the detecting circuit 6. The frequency of the signal produced by the local oscillation circuit 4 is controlled by the signal outputted from a frequency synthesizer 7 including a PLL circuit.

An automatic search operation is performed as follows: An automatic search-start signal is applied to the terminal 8 of the frequency synthesizer 7 so as to change the signal to be outputted from the frequency synthesizer 7. The signal outputted from the frequency synthesizer 7 is applied to the local oscillation circuit 4 comprising a voltage controlled oscillator (VCO). As a result, the frequency of the signal outputted from the local oscillation circuit 4 changes. An automatic search is performed according to the change of the local oscillation signal. When the frequency of a receiver approaches the frequency of the signal transmitted from a broadcasting station, an "L" level signal corresponding to the S-curve characteristic of the detecting circuit 6 is outputted from a muting circuit 9. The "L" level signal outputted from the muting circuit 9 is shaped by a waveform shaping circuit 10, and thereafter, triggers a counter control circuit 11. As a result, a control signal is generated from the counter control circuit 11. Upon receipt of the control signal, a buffer circuit 12 generates a pulse in accordance with the frequency of the IF signal. A counter 13 starts counting pulses upon receipt of the control signal outputted from the counter control circuit 11. When a numerical value counted by the counter 13 has come to a predetermined value (for example, a value corresponding to the IF frequency of 10.7 MHz), the counter 13 generates an automatic search stop signal. As a result, the automatic search operation stops and the receiver starts receiving the signal transmitted from the broadcasting station. When a value of the counter 13 has not reached the predetermined value, the automatic search operation continues by a predetermined channel step, i.e., a tuning frequency is increased or decreased according to the automatic search operation and the counter 13 counts pulses so as to decide whether or not a numerical value has attained a predetermined value.

The receiver is tuned to the frequency of the signal transmitted from a desired broadcasting station by the above-described automatic search operation. The synthesizer 7, the counter 13, and the counter control circuit 11 are formed in one or two microcomputers or large scale integrated circuits (LSIs). The IF amplifying circuit 5, the detecting circuit 6, the muting circuit 9, and the buffer circuit 12 are formed in an integrated circuit (IC) for use in a tuner. Therefore, the automatic search tuner shown in FIG. 2 can be composed of two or three integrated circuits.

The stop signal for stopping the automatic search operation generated by using the counter prevents the malfunction of the automatic search tuner, i.e., the automatic search operation is stopped by the receipt of an interference signal. Accordingly, a signal transmitted from the desired broadcasting station can be reliably received.

However, the automatic search tuner described above has a problem that when an interference signal having a frequency included in a signal-receiving band is generated by an intermodulation interference, the automatic search operation is stopped by the frequency of the interference signal. The frequency of the interference signal is converted into an IF signal when the frequency conversion is made by the mixing circuit. Therefore, the counter is incapable of distinguishing between the frequency of the interference signal and that of a signal transmitted from the desired broadcasting station. Accordingly, the automatic search operation stops.

SUMMARY OF THE INVENTION

The present invention has been made with a view to substantially solving the above-described disadvantage and has for its object to provide an improved automatic search tuner comprising an attenuating means for attenuating a received signal in a predetermined amount in response to a signal indicative of stopping an automatic search operation; a comparing means for comparing the level of an IF signal obtained when the attenuating means is operating with the level of an IF signal stored when the attenuating means is not operating.

According to the present invention, when the automatic search operation stops, the level of a received signal is attenuated by the attenuating means in a predetermined amount. The detecting means detects the difference between the level of an IF signal obtained before the signal received by the receiver is attenuated and the level of the IF signal obtained after the received signal is attenuated. The level difference between the IF signals detected by the detecting means is compared with a reference level. If the level difference is below the reference level, a signal received by the receiver is decided that the signal has been transmitted from the desired broadcasting station. As a result, the automatic search operation stops with signals kept received from the desired broadcasting station. On the other hand, if the level difference is above the reference level, a signal received by the receiver is detected that the signal is an interference signal. As a result, an automatic search operation is resumed.

The automatic search tuner in accordance with the present invention is capable of distinguishing a signal transmitted from a desired broadcasting station from an interference signal generated due to the intermodulation interference. According to the present invention, when the level of an RF signal is attenuated in a predetermined amount, the IF signal of an interference signal is detected based on the fact that the IF signal of the interference signal is greatly attenuated. Accordingly, the interference signal can be reliably detected. Further, since the malfunction of the automatic search operation caused by the interference signal can be reliably prevented, the sensitivity of the RF-AGC can be suppressed to a minimum and even a radio wave having a weak electric field can be received.

BRIEF DESCRIPTION OF THE DRAWINGS

The object and features of the present invention will become apparent from the following description taken in conjunction with preferred embodiment thereof with reference to the accompanying drawings, throughout which like parts are designated by like reference numerals, and in which.

DETAILED DESCRIPTION OF THE INVENTION

Figure 1:
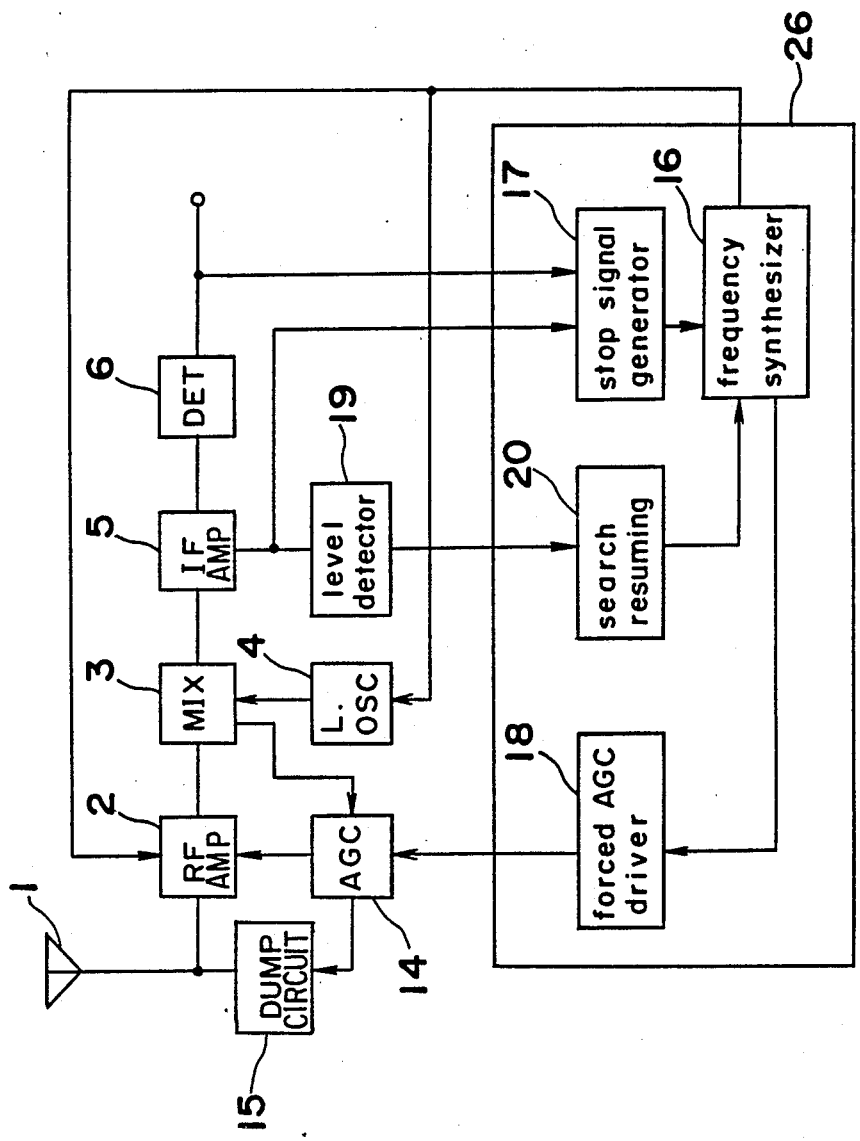
FIG. 1 is a circuit diagram showing one embodiment of the present invention.

FIG. 1 is a circuit diagram of an automatic search tuner constituted by using the IC, wherein a signal received by an antenna 1 is amplified by a radio frequency (RF) amplifying circuit 2, and then, mixed with a signal outputted from a local oscillation circuit 4 so as to convert the signal into an intermediate frequency (IF) signal. The IF signal is amplified by an IF amplifying circuit 5 and detected by a detecting circuit 6 to generate a signal at the output terminal of the detecting circuit 6.

Figure 2:
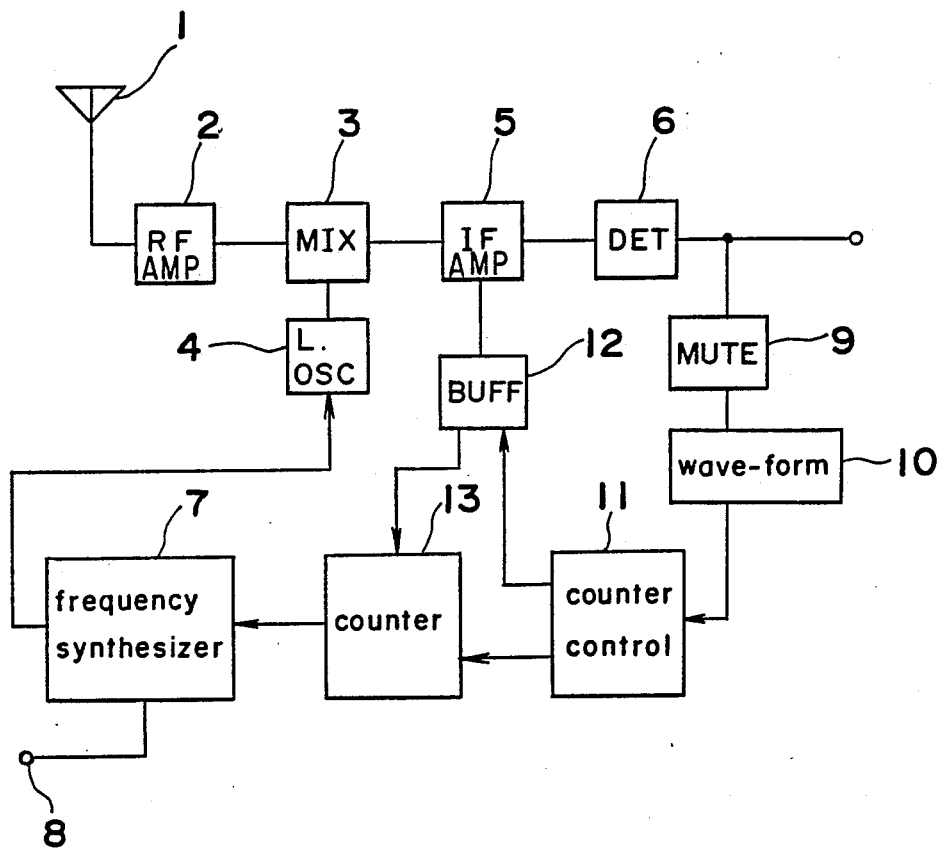
FIG. 2 is a circuit diagram showing a known automatic search tuner.

The above construction of FIG. 1 is the same to parts of the circuits of FIG. 2. An embodiment of the present invention shown in FIG. 1 further comprises a broad band automatic gain control (AGC) circuit 14 which operates according to the level of an RF signal, an antenna dumping circuit 15 for attenuating the level of an RF signal according to the signal outputted from the AGC circuit 14, a frequency synthesizer 16 to control the frequency of a signal outputted from a local oscillation circuit 4 so as to effect the tuning of an automatic search tuner, a stop signal-generating circuit 17 of an IF counting type for generating an automatic search-stop signal in response to the signal outputted from the detecting circuit 6 and the IF signal, a forced-AGC drive circuit 18 for forcing the AGC circuit 14 to operate when an automatic search operation stops, a level-detecting circuit 19 for detecting the level of the IF signal, and a search-resuming circuit 20 for allowing the frequency synthesizer 16 to resume the automatic search operation in response to the signal outputted from the level-detecting circuit 19.

The automatic search operation of the circuit shown in FIG. 1 is performed as follows: First, the frequency synthesizer 16 applies a control signal having a predetermined step to the RF amplifying circuit 2 and the local oscillation circuit 4. Upon receipt of the control signal, the tuning frequencies of the RF amplifying circuit 2 and the oscillation frequency of the local oscillation circuit 4 change. As a result, the tuning state of the automatic search tuner changes. When a signal is received from a broadcasting station, a signal is generated by the detecting circuit 6 according to an S-curve characteristic, and the signal is applied to the stop signal-generating circuit 17. At this time, the frequency of the IF signal supplied by the IF amplifying circuit 5 is checked by the counter provided in the stop signal-generating circuit 17. If it is decided that the frequency of the IF signal is a predetermined frequency, a signal is generated by the stop signal-generating circuit 17. As a result, the frequency synthesizer 16 stops the automatic search operation and generates a control signal so as to operate the forced-AGC drive circuit 18. The forced-AGC drive circuit 18 drives the broad band AGC circuit 14. Consequently, the intensity of the signal generated by the AGC circuit 14 becomes great, which causes the AGC transistor provided in the RF amplifying circuit 2 and the antenna dumping circuit 15 to attenuate the intensity of the signal received by the antenna 1 in a predetermined amount. The memory included in the search-resuming circuit 20 stores the level of the IF signal obtained when the automatic search operation stops, i.e., before the forcing AGC drive circuit 18 starts its operation. The search-resuming circuit 20 also includes a detecting means for detecting the difference between the level of the IF signal obtained when the AGC transistor provided in the RF amplifying circuit 2 and the antenna dumping circuit 15 have attenuated the level of the signal received by the antenna 1 in a predetermined amount and the level of the IF signal, namely, the level of the IF signal obtained when the automatic search is not in operation, stored in the memory included therein. The search-resuming circuit 20 further includes a comparing means for comparing the above-described level difference detected by the detecting means with the reference level.

When two signals with different frequencies are received by the antenna 1, an intermodulation interference occurs due to non-linear elements such as the field effect transistor (FET), the varactor diode, and the transistor constituting the tuner. As a result, an interference signal having a frequency included in the signal receiving-band is generated. The interference signal generated by the intermodulation interference is mainly caused by a tertiary distortion in the case of an FM radio tuner and second tertiary distortions in the case of an AM radio tuner. When the frequency of the interference signal which is included in the signal receiving band and whose intensity increases becomes equal to the tuning frequency of the tuner by the automatic search operation, the interference signal is converted into an IF signal having a predetermined frequency. As a result, the stop signal-generating circuit 17 generates a stop signal, whereby the automatic search operation is stopped.

Figure 3:
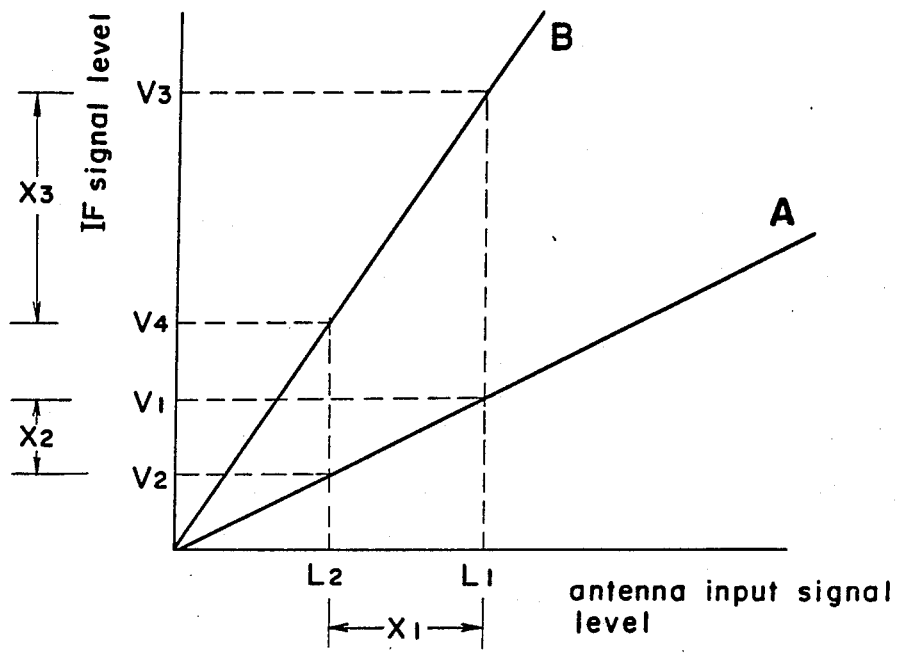
FIG. 3 is a characteristic view for describing the automatic search tuner in accordance with the present invention.

When a signal is received from a desired broadcasting station, the relationship between the level of the signal received by the antenna 1 and the level of the IF signal is as shown by the solid line (A) in FIG. 3. The relationship between the level of the interference signal which is received by the antenna 1 due to the intermodulation interference of an FM tuner and the level of the IF signal is as shown by the solid line (B) in FIG. 3. When the level of a signal received from the desired broadcasting station through the antenna 1 is attenuated by the operation of the forced-AGC drive circuit 18 in the predetermined amount of $X_1$, namely, from $L_1$ to $L_2$, the level of the IF signal is reduced in the predetermined amount of $X_2$, namely, from $V_1$ to $V_2$. On the other hand, when the interference signal is received, the level of the IF signal is reduced in the predetermined amount of $X_3$, namely, from $V_3$ to $V_4$ when the level of the interference signal is attenuated in the same amount of $X_1$. Thus, a signal transmitted from the desired broadcasting station can be distinguished from an interference signal generated due to an intermodulation interference.

Figure 4:
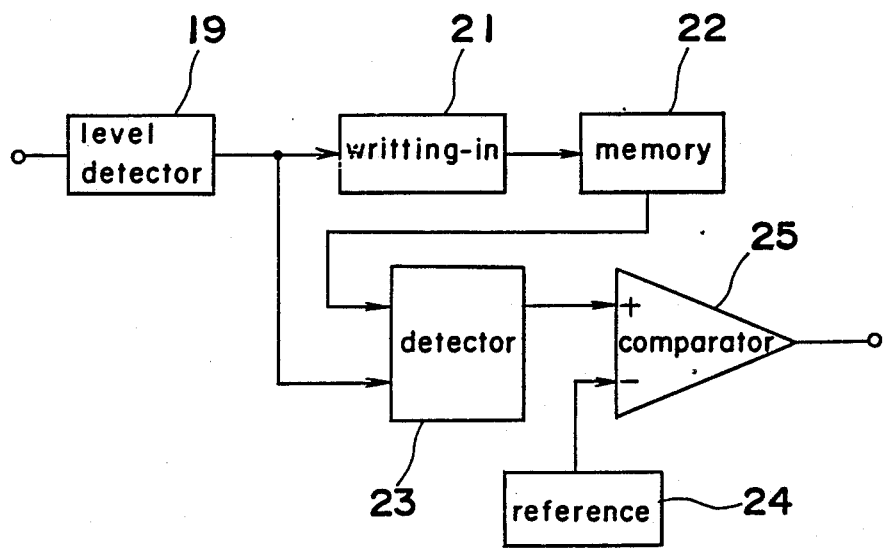
FIG. 4 is an example of the search operation-resuming circuit shown in FIG. 1.

Referring to FIG. 4 showing the circuit of the search-resuming circuit 20 shown in FIG. 1, the search-resuming circuit comprises a memory 22 to which the level of the IF signal obtained before the forced-AGC drive circuit 18 operates is written by a write circuit 21, a detecting circuit 23 for detecting the difference between the level of the IF signal stored in the memory 22 and the level of the IF signal obtained when the forced-AGC drive circuit 18 is operating, and a comparing circuit 25 for comparing the voltage of the signal outputted from the detecting circuit 23 according to the detected level difference with the reference voltage supplied from a reference voltage-generating circuit 24 so as to generate a signal. The reference voltage of the reference voltage-generating circuit 24 is set according to the variation $X_2$ of the IF signal level of the desired broadcasting station corresponding to the amount of $X_1$ which is attenuated from the levels of signals received by the antenna 1 shown in FIG. 3. The comparing circuit 25 generates an "H" level signal when the voltage of the signal outputted from the detecting circuit 23 is greater than the reference voltage and generates an "L" level signal when the voltage of the signal outputted from the detecting circuit 23 is smaller than the reference voltage.

As described above, the variation $X_2$ of the level of the IF signal of the desired broadcasting station is smaller than the variation $X_3$ of the IF signal level of the interference signal. Consequently, when a signal is received from the desired broadcasting station, a signal with a low level is generated at the output terminal of the detecting circuit 23 and when an interference signal is received, a signal with a high level is generated at the output thereof. Accordingly, the level of the signal outputted from the comparing circuit 25 is "L" when the signal is received from the desired broadcasting station and the level of the signal outputted therefrom is "H" when the interference signal is received. The "H" level signal outputted from the comparing circuit 25 is applied to the frequency synthesizer 16 as a search-resuming signal. Therefore, when the interference signal is received, the automatic search operation is stopped and the level of the interference signal is forced to attenuate. As a result, a search-resuming signal is generated to resume an automatic search operation. When a signal is received from the desired broadcasting station, a search-resuming signal is not generated. Therefore, a signal is received in the tuning condition with the automatic search operation stopped.

An interference signal is distinguished from a signal of the desired broadcasting station by directly detecting the level of the IF signal in the embodiment of the present invention, but an IF-AGC is effected in the IF amplifying circuit of a normal tuner. Therefore, it is difficult to directly detect the IF signal. In such a tuner, the level of the IF signal can be detected by means of a signal meter circuit from which a signal indicative of the intensity of electric field of a received signal is obtained not by means of the IF amplifying circuit. The construction of the tuner circuit can be simplified by arranging in a signal microcomputer the frequency synthesizer 16, the forced-AGC drive circuit 18, the stop signal-generating circuit 17, and the search-resuming circuit 20. An automatic search operation can be accurately performed by a program prepared for the microcomputer. An automatic search operation can be also performed as follows: The detecting means 23 shown in FIG. 4 detects the difference in the level of the IF signal stored in the memory 22 when the forced-AGC drive circuit 18 is operating and the level of the IF signal obtained after the forced-AGC drive circuit stops its operation.

Although the present invention has been fully described by way of examples with reference to the accompanying drawings, it is to be noted here that various changes and modification will be apparent to those skilled in the art. Therefore, unless otherwise such changes and modifications depart from the scope of the present invention, they should be construed as being included therein.

What is claimed is:

1. An automatic search tuner, which includes a radio frequency amplifier for amplifying a received signal, means including a local oscillator circuit and a mixer for generating an intermediate frequency signal upon mixing the output signals of the radio frequency amplifier and the local oscillator circuit, means for amplifying the intermediate frequency signal, a frequency synthesizer for changing the output signal frequency of the local oscillator circuit, and a means for producing a stop signal to stop the changing the output signal frequency of the local oscillator circuit upon occurrence of a received signal of a frequency corresponding to a broadcasting station, comprising:

means for detecting the level of the received signal;
memory means for storing the level of the output signal of the level detecting means upon the occurrence of a stop signal;
means for attenuating the level of the received signal by a predetermined amount;
means for detecting the difference between the level of the attenuated received signal and the signal of the memory means; and
means for resuming an automatic search operation by the frequency synthesizer in response to a predetermined signal output from the detecting means.

2. The automatic record tuner as in claim 1, wherein said attenuating means operates after the output signal of the level detecting means has been stored.

3. The automatic search tuner as in claim 1, wherein said attenuating means comprises means for producing a forced automatic gain control signal in response to the stop signal.

4. The automatic search tuner as in claim 3, wherein said attenuating means further comprises means responsive to said forced automatic gain control signal to reduce the level of the output signal from said radio frequency amplifier applied to said mixer means.

5. The automatic search tuner as in claim 1, wherein said level detecting means is connected with the intermediate frequency amplifier to detect the level of the intermediate frequency signal.

6. The automatic search tuner as in claim 1, wherein said search resuming means comprises means for comparing the level of the output of said detecting means with a reference level signal and for producing a control signal to re-start the search when the output of the detecting means differs from the reference level signal in a predetermined manner.

* * * * *